United States Patent
Kim et al.

(10) Patent No.: US 12,531,522 B2
(45) Date of Patent: *Jan. 20, 2026

(54) LOW-NOISE AMPLIFIER SUPPORTING BEAM-FORMING FUNCTION AND RECEIVER INCLUDING THE SAME

(71) Applicant: SAMSUNG ELECTRONICS CO., LTD., Suwon-si (KR)

(72) Inventors: Young-min Kim, Suwon-si (KR); Jae-seung Lee, Hwaseong-si (KR); Jung-seok Lim, Seoul (KR); Pil-sung Jang, Uijeongbu-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 193 days.

This patent is subject to a terminal disclaimer.

(21) Appl. No.: 18/502,458

(22) Filed: Nov. 6, 2023

(65) Prior Publication Data
US 2024/0080002 A1 Mar. 7, 2024

Related U.S. Application Data

(63) Continuation of application No. 16/914,391, filed on Jun. 28, 2020, now Pat. No. 11,855,589, which is a
(Continued)

(30) Foreign Application Priority Data

Oct. 13, 2017 (KR) .................. 10-2017-0133483
Apr. 26, 2018 (KR) .................. 10-2018-0048473

(51) Int. Cl.
*H03F 1/22* (2006.01)
*H03F 3/189* (2006.01)
(Continued)

(52) U.S. Cl.
CPC .............. *H03F 3/189* (2013.01); *H03F 1/22* (2013.01); *H03F 1/223* (2013.01); *H03F 3/193* (2013.01);
(Continued)

(58) Field of Classification Search
CPC ....................................................... H03F 1/22
(Continued)

(56) References Cited

U.S. PATENT DOCUMENTS 6,864,750 B2 * 3/2005 Shigematsu ............ H03F 1/223
330/311
7,126,420 B2 10/2006 Kodim
(Continued)

FOREIGN PATENT DOCUMENTS

| CN | 101253682 | 8/2008 |
| CN | 106716850 | 5/2017 |
| WO | 2017073846 | 5/2017 |

OTHER PUBLICATIONS

Ahmad, "A Phase Shifting Low Noise Amplifier (LNA) for 60 GHz Beam-forming in 0.13-μm CMOS," M.S. Thesis, Seoul National University, Aug. 2011, 11 pages.
(Continued)

*Primary Examiner* — Henry Choe
(74) *Attorney, Agent, or Firm* — Morgan, Lewis & Bockius LLP

(57) ABSTRACT

A low-noise amplifier in a receiver supporting a beam forming function may selectively change a phase shift for beam steering. The low-noise amplifier may include first and second transistors and a variable capacitance circuit connected to a gate of the second transistor. The variable capacitance circuit may selectively change capacitance thereof based on a capacitance control signal applied thereto according to beam-forming information, where the changed
(Continued)

capacitance correspondingly causes a phase change in an output signal of the low-noise amplifier. A similar scheme may be employed for amplifiers in transmit signal paths to steer a transmit beam.

20 Claims, 16 Drawing Sheets

Related U.S. Application Data continuation of application No. 16/156,130, filed on Oct. 10, 2018, now Pat. No. 10,715,091.

(51) Int. Cl.
    *H03F 3/193*     (2006.01)
    *H03F 3/72*     (2006.01)
    *H03H 7/19*     (2006.01)

(52) U.S. Cl.
    CPC ................ *H03F 3/72* (2013.01); *H03H 7/19* (2013.01); *H03F 2200/294* (2013.01); *H03F 2200/61* (2013.01); *H03F 2203/7206* (2013.01)

(58) Field of Classification Search
    USPC .................................................. 330/311, 310
    See application file for complete search history.

(56) References Cited

U.S. PATENT DOCUMENTS

| | | | |
|---|---|---|---|
| 7,167,044 B2 | 1/2007 | Li et al. | |
| 7,352,247 B2 | 4/2008 | Oh et al. | |
| 7,592,873 B2 * | 9/2009 | Satoh | H03G 1/0035 330/144 |
| 7,692,490 B2 | 4/2010 | Cho et al. | |
| 7,812,775 B2 | 10/2010 | Babakhani et al. | |
| 7,834,704 B2 | 11/2010 | Hijikata et al. | |
| 8,405,462 B2 | 3/2013 | Martineau et al. | |
| 8,610,477 B2 | 12/2013 | Koechlin et al. | |
| 8,680,928 B2 * | 3/2014 | Jeon | H03F 1/223 330/311 |
| 9,035,697 B2 | 5/2015 | Youssef et al. | |
| 9,906,205 B2 | 2/2018 | Asai et al. | |
| 10,715,091 B2 | 7/2020 | Kim et al. | |
| 2003/0011436 A1 | 1/2003 | Shigematsu | |
| 2007/0117523 A1 | 5/2007 | Weber et al. | |
| 2010/0264988 A1 | 10/2010 | Huang et al. | |
| 2012/0182067 A1 | 7/2012 | Prasad et al. | |
| 2013/0337757 A1 | 12/2013 | Szortyka et al. | |
| 2014/0132450 A1 | 5/2014 | Chen et al. | |
| 2016/0087587 A1 | 3/2016 | Wang et al. | |
| 2019/0115880 A1 | 4/2019 | Kim et al. | |
| 2020/0336121 A1 | 10/2020 | Kim et al. | |

OTHER PUBLICATIONS

Chinese Office Action dated Apr. 25, 2021 for corresponding Chinese Application No. 201811188950.6 (in Chinese), 7 pages.
Korean Office Action dated Apr. 22, 2022 in corresponding Korean Patent Application No. 10-2018-0048473 (in Korean), 6 pages.
Notice of Allowance dated Oct. 19, 2021 in corresponding Chinese Patent Application No. 201811188950.6 (in Chinese), 4 pages.
Office Action dated Dec. 23, 2021 in corresponding Taiwanese Patent Application No. 1071359060 (in Chinese), 10 pages.
Yu, et al., "A 60 GHz Phase Shifter Integrated With LNA and PA in 65 nm CMOS for Phased Array Systems," IEEE Journal of Solid-State Circuits, vol. 45, No. 9, Sep. 2010, pp. 1697-1699.

\* cited by examiner

LOW-NOISE AMPLIFIER SUPPORTING BEAM-FORMING FUNCTION AND RECEIVER INCLUDING THE SAME

CROSS-REFERENCE TO RELATED APPLICATIONS

This application is a continuation of U.S. patent application Ser. No. 16/914,391, filed Jun. 28, 2020, which is a continuation of U.S. patent application Ser. No. 16/156,130, filed Oct. 10, 2018, now U.S. Pat. No. 10,715,091, which claims priority under 35 U.S.C. § 119 to Korean Patent Application Nos. 10-2017-0133483, filed on Oct. 13, 2017, and 10-2018-0048473, filed on Apr. 26, 2018, in the Korean Intellectual Property Office, the disclosures of which are incorporated herein by reference in their entireties.

TECHNICAL FIELD

The inventive concept relates to a low-noise amplifier for supporting a beam-forming function, a receiver and transceiver including the low-noise amplifier, and phase shifting circuitry in the receiver/transceiver.

DISCUSSION OF THE RELATED ART

A phase shifter composed of passive elements may change the phase of a signal while maintaining linearity without consuming direct current (DC) power. However, in the phase shifter, insertion loss is relatively large due to the passive elements, and thus, a low-noise amplifier may be employed to compensate for the insertion loss. In addition, since the passive elements are large in size, a problem arises in applying a general phase shifter to an integrated phased array system in the form of a chip.

A phase shifter composed of active elements may have satisfactory gain and accuracy and a high integration level. This active type phase shifter is thereby suitable for integration within a chip. However, to meet requisite performance in a typical beam-forming system, low-noise amplifiers are used in addition to the active type phase shifter, resulting in increased power consumption.

SUMMARY

The inventive concept provides a low-noise amplifier that supports a beam-forming function, has reduced insertion loss and reduced amplification gain variation, and is small in size in comparison to conventional amplifiers. Thereby, the size of a radio frequency (RF) chip with which the low-noise amplifier is embedded, may be reduced relative to current RF chips.

The inventive concept also provides a receiver including the low-noise amplifier.

According to an aspect of the inventive concept, there is provided a receiver for receiving a beam-forming signal via a plurality of antennas. The receiver may include at least one phase shift low-noise amplifier having first and second amplifier circuits and a variable capacitance circuit. The first amplifier circuit may have a first transistor for amplifying an input signal to provide a first amplified signal, where the input signal is derived from a portion of the beam-forming signal received by one of the antennas. The second amplifier circuit may have a second transistor for amplifying the first amplified signal to generate a corresponding output signal. The variable capacitance circuit may selectively change its capacitance to cause a corresponding phase change in the output signal.

According to another aspect of the inventive concept, there is provided a low-noise amplifier for supporting a beam-forming function. The low-noise amplifier may include first and second transistors, each having a gate, a source and a drain, where the source of the second transistor is connected to the drain of the first transistor. The first transistor amplifies an input signal received at its gate and provides a corresponding first amplified signal at its drain. The second transistor amplifies the first amplified signal to provide a corresponding output signal at its drain. A variable capacitance circuit connected to a gate of the second transistor selectively changes its capacitance based on a capacitance control signal applied thereto according to beam-forming information. The changed capacitance correspondingly causes a phase change in the output signal.

According to still another aspect of the inventive concept, there is provided a wireless communication device for supporting a beam-forming function. The wireless communication device includes a low-noise amplifier that amplifies an input signal derived from a beam-forming signal received from an external source and outputs a corresponding output signal. The low-noise amplifier includes a variable capacitance circuit for selectively changing a phase of the output signal. A phase shifter is coupled to an output terminal or an input terminal of the low-noise amplifier, where the phase shifter further changes the phase of the output signal. A control circuit generates a capacitance control signal for the variable capacitance circuit and a control signal for the phase shifter based on beam-forming information.

According to yet another aspect of the inventive concept, there is provided a transceiver for supporting a beam-forming function. The transceiver comprises a receiver portion including N receive signal paths respectively coupled to N antennas that collectively receive a beam-forming signal. Each of the N receive signal paths may include a phase shift low-noise amplifier comprising: a first amplifier circuit comprising a first transistor for amplifying an input signal to provide a first amplified signal, the input signal being derived from a portion of the beam-forming signal received by a respective one of the N antennas; a second amplifier circuit comprising a second transistor for amplifying the first amplified signal to generate a corresponding output signal; and a variable capacitance circuit for selectively changing capacitance thereof to cause a corresponding phase change in the output signal. The transceiver may further include a transmitter portion comprising N phase shift power amplifiers, each having substantially the same configuration as the phase shift low-noise amplifier.

BRIEF DESCRIPTION OF THE DRAWINGS

Embodiments of the inventive concept will be more clearly understood from the following detailed description taken in conjunction with the accompanying drawings, in which like reference characters indicate like elements or features, wherein.

DETAILED DESCRIPTION OF EMBODIMENTS

Hereinafter, embodiments of the present disclosure will be described in detail with reference to the accompanying drawings.

Figure 1:
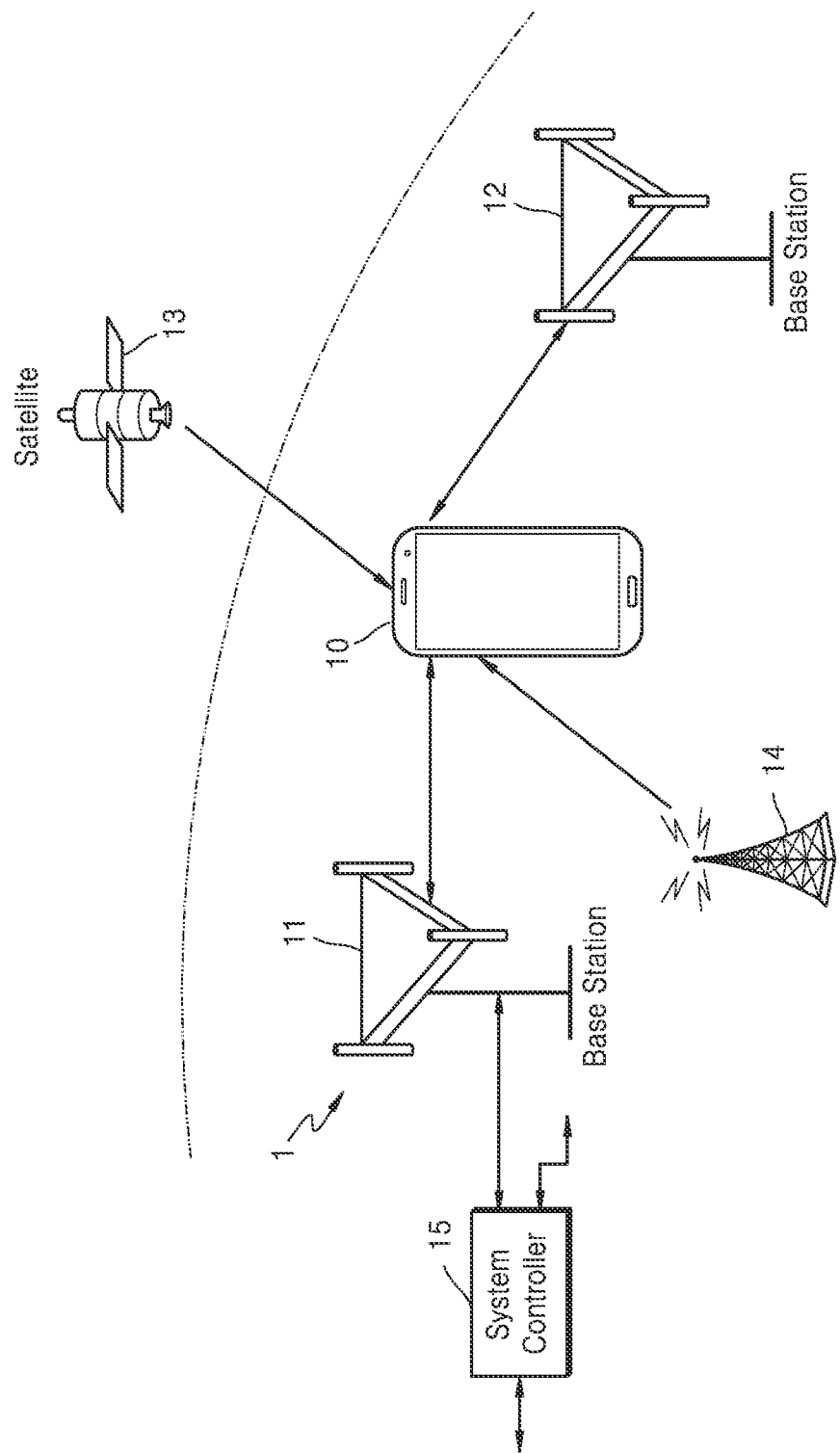
FIG. 1 is a diagram illustrating a wireless communication system including a wireless communication device performing wireless communication operations.

FIG. 1 is a diagram illustrating a wireless communication system, 1, including a wireless communication device 10 that performs wireless communication operations. The wireless communication system 1 may be, e.g., a long term evolution (LTE) system, a code division multiple access (CDMA) system, a global system for mobile communication (GSM) system, a 5 G system, or a wireless local area network (WLAN) system. Also, a CDMA system may be implemented in various CDMA versions, e.g., wideband CDMA (WCDMA), time-division synchronized CDMA (TD-SCDMA), cdma2000, etc.

The wireless communication system 1 may include at least two base stations 11 and 12, a system controller 15, and may include other network entities such as a satellite 1 and a broadcast station 14. The wireless communication device 10 may be referred to as user equipment (UE), a mobile station (MS), a mobile terminal (MT), a user terminal (UT), a subscriber station (SS), a portable device, etc. The base stations 11 and 12 may be fixed stations that communicate with the wireless communication device 10 and/or other base stations to transmit and receive radio frequency (RF) signals including data signals and/or control information. The base stations 11 and 12 may each be referred to as a node B, an evolved-Node B (eNB), a base transceiver system (BTS), an access point (AP), etc. (It is noted that just a single base station may be employed in a local area communication system.)

The wireless communication device 10 may communicate with the wireless communication system 1, and may receive signals from broadcast station 14. Moreover, the wireless communication device 10 may receive signals from satellite 13 of a global navigation satellite system (GNSS). The wireless communication device 10 may support radio technology for wireless communication (for example, LTE, cdma2000, WCDMA, TD-SCDMA, GSM, 802.11, etc.)

The wireless communication device 10 may include a plurality of antennas and may support a beam-forming function. For example, the wireless communication device 10 with beam-forming capability may collectively receive an RF signal through the plurality of antennas, where each of the antennas captures a portion of the RF signal. Each signal portion may be routed from one antenna to a respective RF signal path including at least a low-noise amplifier, where each RF signal path is assigned a different insertion phase. The signals in the RF signal paths are amplified and then combined, to thereby selectively form a receive beam pointing in a desired direction, due to the different phases in the respective signal paths. Herein, the RF signal collectively received by the antennas (and in some cases, just one of the signal portions provided by one antenna) may be interchangeably referred to as a received beam-forming signal, a beam-forming receive signal, or just an input signal. In addition, on transmit, the wireless communication device 10 may frequency-up-convert a baseband data signal to an RF transmit signal and may perform a beam-forming operation of changing the phase of the RF transmit signal in one or more antenna-connected RF transmit signal paths to thereby emit a beam-forming transmit signal in a desired direction through the antennas.

A low-noise amplifier of the wireless communication device 10 according to an embodiment may amplify a received beam-forming signal (more precisely, a portion of the beam-forming signal received by one of the antennas) and output the amplified beam-forming signal as an output signal, and may selectively change the phase of the output signal according to information about the beam-forming signal. Also, the low-noise amplifier of the wireless communication device 10 may have a configuration capable of maintaining a relatively constant amplification gain over a range of selected phase shifts, and may be implemented as a multi-stage circuit to improve the amplification gain.

Figure 2:
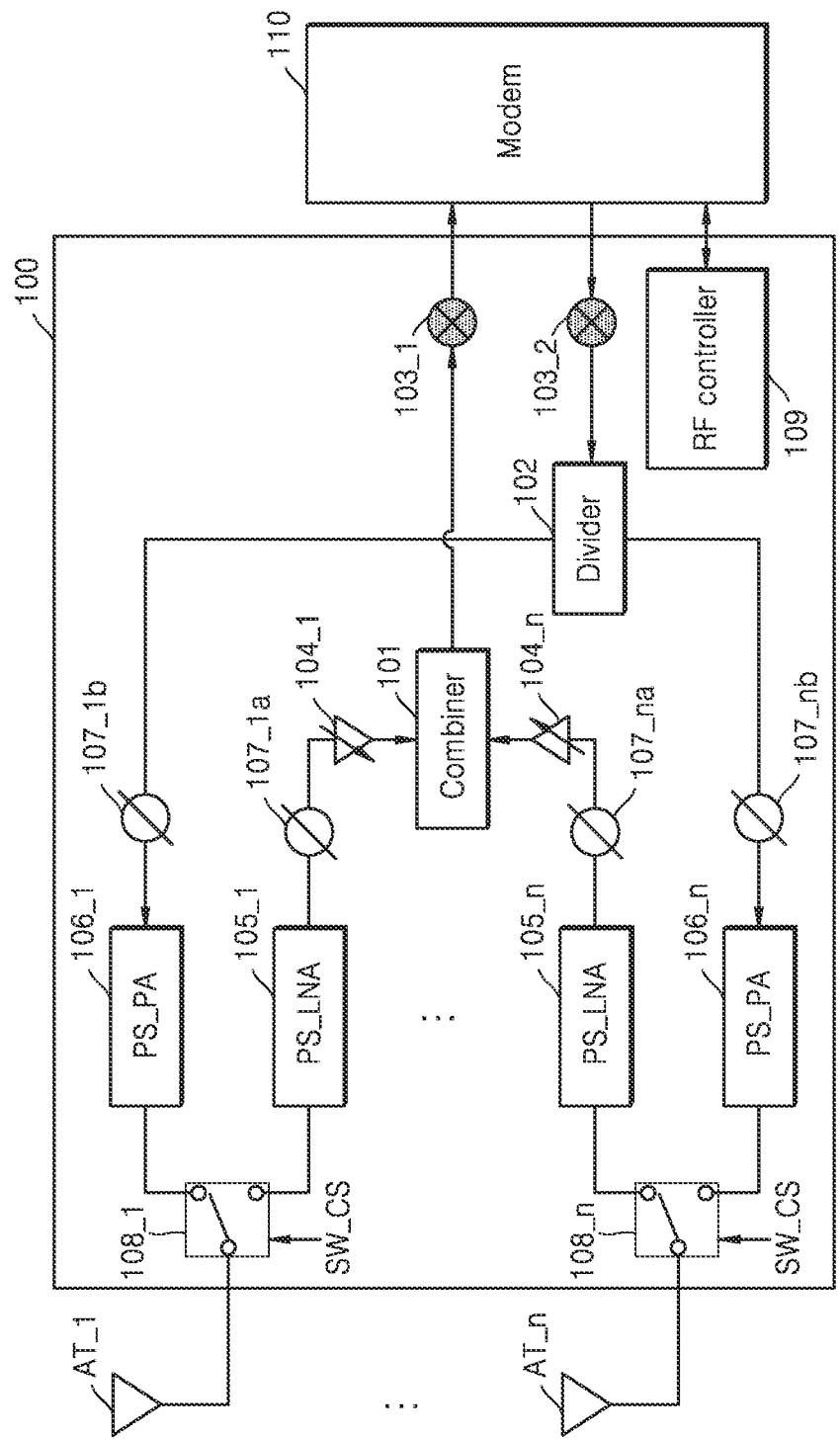
FIG. 2 is a block diagram of a transceiver according to an embodiment.

FIG. 2 is a block diagram of a transceiver 100 according to an embodiment. The transceiver 100 shown in FIG. 2 may be included in the wireless communication device 10 of FIG. 1 and may support a beam-forming function. The transceiver 100 of FIG. 2 may perform beam-forming in an RF band.

As shown in FIG. 2, the transceiver 100 may include antennas AT_1 to AT_n, a combiner 101, a divider 102, mixers 103_1 and 103_2, variable gain amplifiers 104_1 to 104_n, low-noise amplifiers (interchangeably, "phase shift-low-noise amplifiers" (PS_LNAs)) 105_1 to 105_n, power amplifiers (or "phase shift-power amplifiers" (PS_PAs)) 106_1 to 106_n, phase shifters 107_1a to 107_na and 107_1b to 107_nb, and transmit/receive (T/R) selection switches 108_1 to 108_n. The transceiver 100 may further include a plurality of bandpass filters (not shown) respectively connected to the antennas AT_1 to AT_n, e.g., with each of the bandpass filters coupled between one of the antennas AT_1 to AT_n and one of the T/R selection switches 108_1 to 108_n. In an embodiment, the transceiver 100 may employ a direct conversion structure that uses a single frequency converter that directly converts an RF signal into a baseband signal on receive, and/or directly converts a baseband signal into an RF signal on transmit. In the present disclosure, the direct conversion may be performed by the mixers 103_1 and 103_2. A signal (e.g. a local oscillator (LO) signal, not shown) having a reference frequency used for frequency band conversion may be applied to the mixers 103_1 and 103_2. In addition, the transceiver 100 may be a beam-forming transceiver that merges RF signals (on receive) or divides an RF signal (on transmit) by using the combiner 101 and the divider 102 and uses the low-noise amplifiers 105_1 to 105_n, the power amplifiers 106_1 to 106_n, and the phase shifters 107_1a to 107_na and 107_1b to 107_nb.

Hereafter, the appendage "i" of a legend will be used to refer to any element in a set of elements denoted with appendages of "1 to n". Thus, for example, power amplifier 106_i is understood to mean any of the power amplifiers 106_1 to 106_n; low noise amplifier 105_i is understood to mean any of the low noise amplifiers 105_1 to 105_n; etc.

The transceiver 100 according to the present embodiment may perform a receive operation as a receiver as follows. In the transceiver 100, each of antennas AT_1 to AT_n captures a portion of an RF receive signal, so that antennas AT_1 to T_N may be said to collectively capture a beam-forming signal. N portions of the RF receive signal received through the antennas AT_1 to AT_n may respectively pass through the T/R selection switches 108_1 to 108_n, the low-noise amplifiers 105_1 to 105_n, the phase shifters 107_1a to 107_na, and the variable gain amplifiers 104_1 to 104_n, and are then combined into one signal through the combiner 101. Each low-noise amplifier 105_i may be part of one receive signal path coupled to a respective antenna AT_i of the antennas AT_1 to AT_n. An "$i^{th}$" receive signal path may be a path from antenna AT_i to an output port of variable gain amplifier 104_i. To form a receive beam in a desired direction other than a direction normal to an array plane of the antennas, at least two of the receive signal paths are configured with different relative insertion phases (different phase shifts). In an embodiment, each of the n signal paths is assigned a different phase shift.

A combined signal may be mixed with a signal (e.g., an LO signal, not shown) having a reference frequency by the mixer 103_1 and thereby down-converted into a baseband signal. The baseband signal may be input to a modem 110. In an embodiment, any of the low noise amplifiers, e.g., the low-noise amplifier 105_1 (hereafter an example of a "first low-noise amplifier") may amplify a beam-forming signal by a certain amplification gain and output the amplified beam-forming signal as an output signal. At the same time, the low-noise amplifier 105_1 may selectively change the phase of the output signal according to information about the beam-forming signal, hereafter referred to interchangeably as "beam-forming information" or just "information". This information may be received from an external source such as a base station. Alternatively, in other applications the information may be generated by the electronic device 10 itself, such as when forming/steering a beam to improve receive signal quality and/or minimize multi-path interference.

For example, the modem 110 may receive the beam-forming information from a base station through a physical downlink control channel (PDCCH), process the information and provide it to an RF controller 109. The beam-forming information may include information indicating a beam-forming method and information about phase-shift by beam-forming, and may be defined in a downlink control information (DCI) format for downlink scheduling. The RF controller 109 may provide a first control signal for a selective phase change of the output signal to the low-noise amplifier 105_1 based on the processed information about the beam-forming signal. Although an example in which the RF controller 109 is included in the transceiver 100 is shown in FIG. 2, the present embodiment is not limited thereto. For example, the RF controller 109 may be included in the modem 110.

The phase shifter 107_1a, which is a first phase shifter, may receive the output signal from the low-noise amplifier 105_1 and change the phase of the output signal. The RF controller 109 may provide a second control signal to the phase shifter 107_1a and control a degree of phase change in an output signal of the phase shifter 107_1a. The phase shifter 107_1a may variously change the phase of the output of the phase shifter 107_1a to conform to beam-forming, based on the second control signal. The same implementations and operations of the low-noise amplifier 105_1, which is the first low-noise amplifier, and the phase shifter 107_1a, which is the first phase shifter, may be applied to the low-noise amplifiers 105_2 to 105_n, which are second to n-th low-noise amplifiers, and the phase shifters 107_2a to 107_na, which are second to n-th phase shifters.

The transceiver 100 according to the present embodiment may perform a transmit operation as a transmitter as follows. A baseband signal output from the modem 110 may be mixed with a local oscillator signal having a reference frequency in the mixer 103_2 and thereby up-converted into an RF signal. The RF signal may be divided into n RF signals through the divider 102. Then, the RF signals may be phase-changed and amplified through the phase shifters 107_1b to 107_nb and the power amplifiers 106_1 to 106_n, and then transmitted as transmit beam-forming signals through the T/R selection switches 108_1 to 108_n and the antennas AT_1 to AT_n into free space. The power amplifiers 106_1 to 106_n may perform amplification operations on signals and selective phase change operations in the same manner as the low-noise amplifiers 105_1 to 105_n, and the configuration of the power amplifiers 106_1 to 106_n may be the same as or similar to the configuration of the low-noise amplifiers 105_1 to 105_n. Accordingly, each power amplifier 106_i may be part of a transmit signal path coupled to a respective antenna AT_i of the antennas AT_1 to AT_n. To form a transmit beam in a desired direction other than a direction normal to an array plane of the antennas, at least two of the transmit signal paths are configured with different relative insertion phases (different phase shifts). Due to the independent phase shifting in the transmit and receive signal paths, the beam pointing direction on transmit may be controlled to be the same or different from that on receive.

The configuration of the transceiver 100 shown in FIG. 2 has been presented as an example embodiment, but various alternative configurations may be implemented based on the inclusion of the low-noise amplifiers 105_1 to 105_n and the power amplifiers 106_1 to 106_n, which may perform amplification operations and selective phase change operations. Furthermore, the transceiver 100 may be implemented such that the transceiver 100 omits the phase shifters 107_1a to 107_na and 107_1b to 107_nb. In this case, the low-noise amplifiers 105_1 to 105_n and the power amplifiers 106_1 to 106_n may cover phase change operations of the phase shifters 107_1a to 107_na and 107_1b to 107_nb. In addition, when the number of RF paths in the transceiver 100 is small and the size of a chip including the transceiver 100 may be allowed to remain relatively large, the transceiver 100 may be implemented such that the transceiver 100 does not include the T/R selection switches 108_1 to 108_n, but instead includes n transmitting antennas and n receiving antennas. Hereinafter, the operation of the receiver portion of the transceiver 100 will be mainly described. However, operations and configurations described below may also be applied to the transmitter portion of transceiver 100 (e.g. power amplifiers 106_1 to 106_n, phase shifters 107_1b to 107_nb, etc.).

Herein, in the context of an amplifier circuit, "output signal" may refer either to a signal outputted by a particular component, or a signal finally outputted by the amplifier circuit. Thus, an "output signal" may be an intermediate signal at a circuit node between amplifier stages or between transistors, or, may be a final output signal of the amplifier circuit, depending on the circuit node at which the output signal is provided.

Herein, the terms gate, source and drain may be used to refer to a gate terminal, a source terminal, and a drain terminal, respectively, of a field effect transistor (FET). Herein, "gain" refers to amplification gain.

Figure 3:
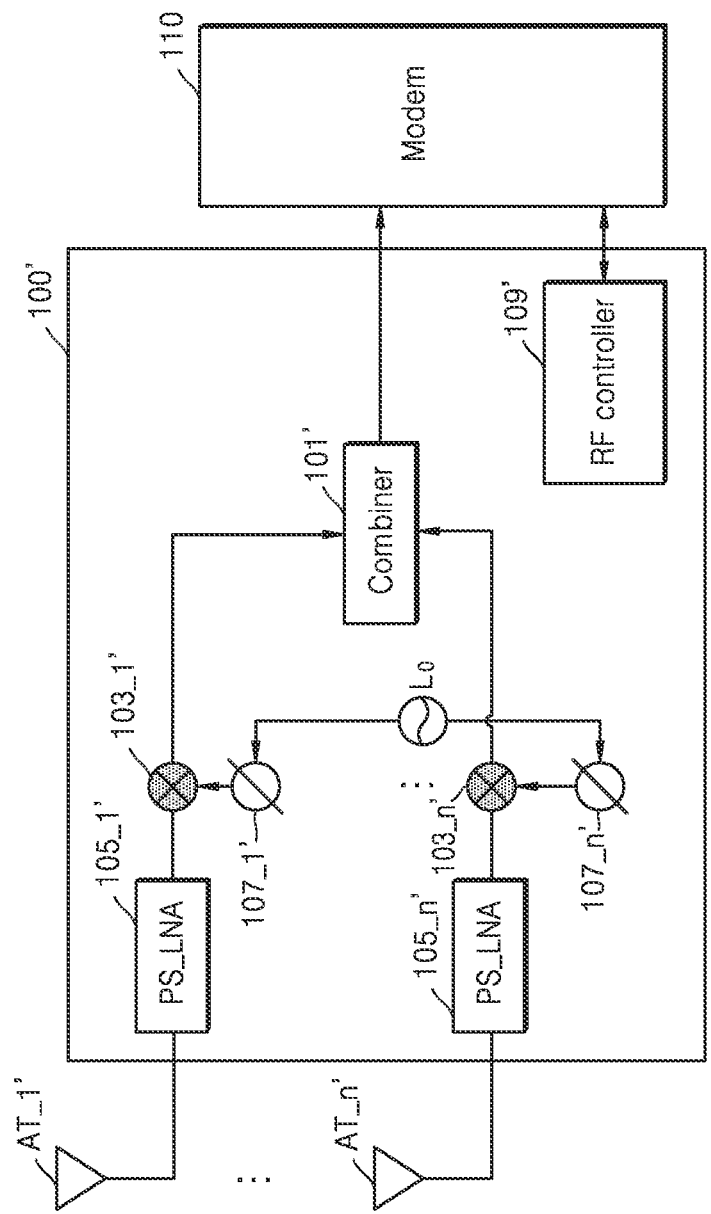
FIG. 3 is a block diagram of a receiver according to an embodiment.

FIG. 3 is a block diagram of a receiver 100' according to an embodiment. The receiver 100' of FIG. 3 may perform beam-forming by means of selective phase shifting of a local oscillator signal.

As shown in FIG. 3, the receiver 100' may include antennas AT_F to AT_n', a combiner 101', mixers 103_1' to 103_n', phase shift-low-noise amplifiers (hereafter, just "LNAs") 105_1' to 105_n', phase shifters 107_1' to 107_n', an RF controller 109', and a local oscillator $L_O$.

In the receiver 100' according to the present embodiment, beam-forming signals (RF signals) received through the antennas AT_F to AT_n' may be provided to the mixers 103_1' to 103_n' as amplified signals via LNAs 105_1' to 105_n'. A signal having a certain frequency, generated by the local oscillator $L_O$, may be provided to the mixers 103_1' to 103_n' as a reference signal via the phase shifters 107_1' to 107_n'. The amplified signals may be mixed with the reference signals in the mixers 103_1' to 103_n' and thereby down-converted into baseband signals, and the baseband signal may be input to a modem 110.

In an embodiment, the LNA 105_1', which is a first LNA, may be implemented as a variable gain amplifier, and may amplify a beam-forming signal by a certain gain and output the amplified beam-forming signal as an output signal. Concurrently, the LNA 105_1' may selectively change the phase of the output signal according to beam-forming information.

The phase shifter 107_1', which is a first phase shifter, may receive a local oscillation (LO) signal generated by the local oscillator Lo and change the phase of the LO signal. The RF controller 109' may provide a first control signal to the LNA 105_1' and control a selective phase change of the output signal of the LNA 105_1', and may provide a second control signal to the phase shifter 107_1' and control a degree of phase change of the LO signal.

The LNA 105_1' may output the output signal to the mixer 103_1', and the phase shifter 107_1' may output a phase-changed LO signal to the mixer 103_1' as a reference signal. The output signal may be mixed with the reference signal in the mixer 103_1' and thereby down-converted into a baseband signal, and the baseband signal may be provided to the combiner 101'. The implementations and operations of the LNA 105_1', which is the first LNA, and the phase shifter 107_1', which is the first phase shifter, may be the same as those of the LNAs 105_2' to 105_n', which are second to n-th LNAs, and the phase shifters 107_2' to 107_n', which are second to n-th phase shifters.

Figure 4:
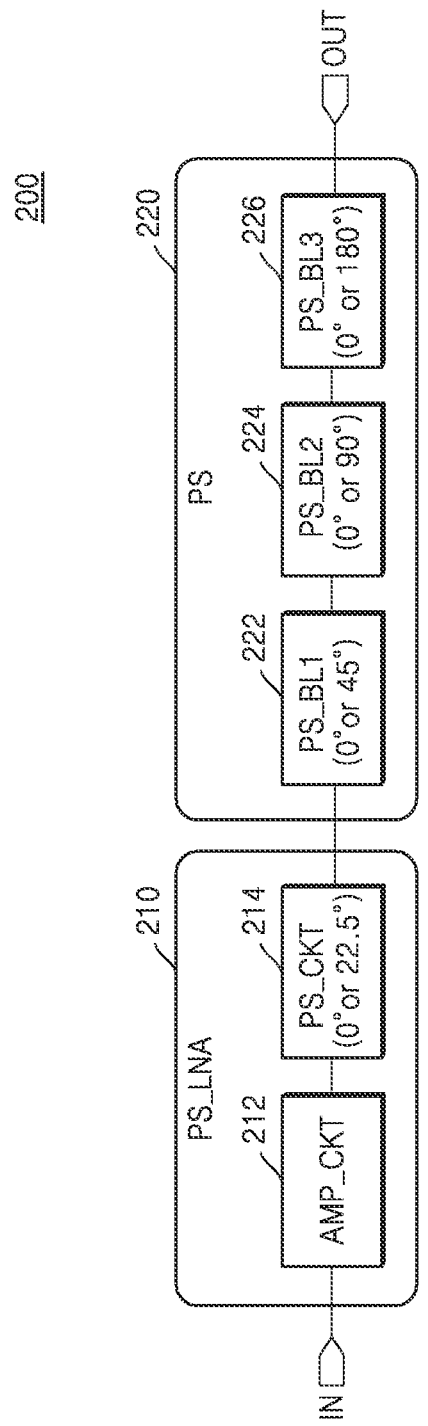
FIG. 4 is a block diagram of a receiver circuit according to an embodiment.

FIG. 4 is a block diagram of a receiver circuit, 200, according to an embodiment. The receiver circuit 200 may include a low-noise amplifier (LNA) 210 and a phase shifter 220 connected in series. Accordingly, receiver circuit 200 may be used for any combination of PS_LNA 105_i with phase shifter 107_i of FIG. 2. The low-noise amplifier 210 may include an amplifier circuit 212 and a phase shift circuit 214. The amplifier circuit 212 may amplify a received beam-forming signal, and the phase shift circuit 214 may be connected to the amplifier circuit 212 and selectively change the phase of the amplified beam-forming signal from the amplifier circuit 212. For example, the phase shift circuit 214 may change the phase of the amplified beam-forming signal by 0 degrees or 22.5 degrees ($\pi/8$ radians), where a 0 degree phase shift is understood to mean a reference phase shift, which may be a minimum phase shift. For example, the phase shift circuit 214 may be implemented such that an internal capacitance value is varied, to change the phase of the amplified beam-forming signal.

The phase shifter 220 may include a plurality of phase shift blocks, e.g., first to third phase shift blocks 222 to 226. Although an example in which the phase shifter 220 includes three phase shift blocks is shown in FIG. 4, the present embodiment is not limited thereto and the phase shifter 220 may include various numbers of phase shift blocks. In addition, the first to third phase shift blocks 222 to 226 may have different phase shift ranges. For example, the first phase shift block 222 may change the phase of a signal to 0 degrees or 45 degrees, the second phase shift block 224 may change the phase of a signal to 0 degrees or 90 degrees, and the third phase shift block 226 may change the phase of a signal to 0 degrees or 180 degrees. The receiver 200 may support a beam-forming function by changing the phase of a signal from 0 degrees to 337.5 degrees in units of 22.5 degrees through the low-noise amplifier 210 and the phase shifter 220. As such, since the low-noise amplifier 210 may replace a part of the phase shifter 220 and perform a phase change operation on a signal, the phase shifter 220 may be designed to be relatively small, thereby reducing the size of an RF chip in which the receiver 200 is integrated.

The degree of phase change of the low-noise amplifier 210 and the phase shifter 220 may be controlled by the RF controller 109 of FIG. 2. For example, when it is desired to change the phase of a received signal by about 22.5 degrees ($\pi/8$ radians) according to beam-forming information, the RF controller 109 may provide control signals to the low-noise amplifier 210 and the phase shifter 220 and control the low-noise amplifier 210 and the phase shifter 220 such that only a 22.5-degree phase shift operation of the phase shift circuit 214 is performed. When the phase of a received signal needs to be changed by 45 degrees ($\pi/4$ radians) according to beam-forming information, the RF controller 109 may provide control signals to the low-noise amplifier 210 and the phase shifter 220 and control the low-noise amplifier 210 and the phase shifter 220 such that only a 45-degree phase shift operation of the first phase shift block 222 is performed.

The configuration of the receiver 200 shown in FIG. 4 is merely an example embodiment and may be implemented to change the phase of a signal in various alternative phase change units to support a beam-forming function. Furthermore, the phase shift circuit 214 may be implemented such that the phase of a signal may be changed to various alternative degrees. For example, the phase shift circuit 214 may be implemented to change the phase of a signal to any or approximately any of 0, 22.5, and 45 degrees, and the phase shifter 220 may have various configurations that may be compatible with the implementation of the phase shift circuit 214.

Figure 5:
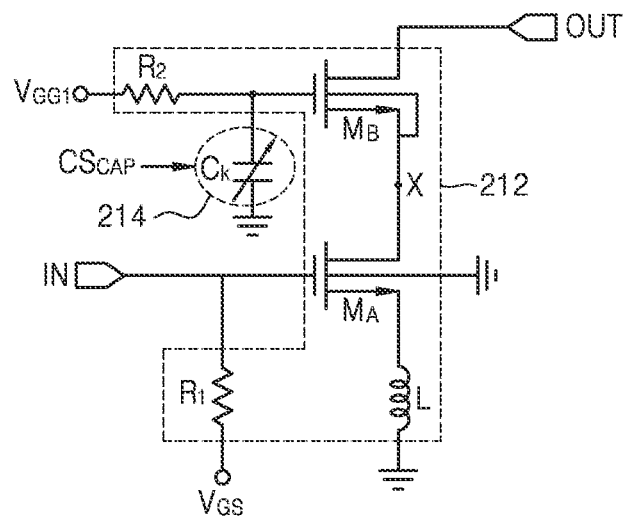
FIG. 5 is a circuit diagram of a low-noise amplifier capable of selectively changing a signal phase, according to an embodiment.

FIG. 5 is a circuit diagram of a low-noise amplifier (LNA) 210a capable of selectively changing a signal phase, according to an embodiment. LNA 210a is an example amplifier that may be used for any of the PS_LNAs 210, 105_1 to 105_n, or 105_1' to 105_n' discussed above.

As shown in FIG. 5, the low-noise amplifier 210a may include an amplifier circuit 212 and a phase shift circuit 214. Hereinafter, the phase shift circuit 214 is referred to as a variable capacitance circuit 214. The amplifier circuit 212 may include a first transistor $M_A$, a second transistor $M_B$, first and second resistor elements $R_1$ and $R_2$, and an inductor element L. A gate of the first transistor $M_A$ may be connected to the first resistor element $R_1$, and the first transistor $M_A$ may receive an input signal through the gate thereof. The input signal is derived from a portion of a beam forming signal received by one of the antennas of FIG. 1. A source terminal of the first transistor $M_A$ may be connected to the inductor element L. The inductor element L may be a source degeneration inductor connected between the source terminal of the first transistor $M_A$ and ground (i.e., a point of reference potential). The source degeneration inductor may be used to improve noise figure and impedance matching. Transistors $M_A$ and $M_B$ are exemplified as NFETs, but may be alternatively embodied as PFETs.

A source of the second transistor $M_B$ may be connected to a drain of the first transistor $M_A$ and a node, to which the source of the second transistor $M_B$ and the drain of the first transistor $M_A$ are connected, may be referred to as an 'X' node. A gate of the second transistor $M_B$ may be connected to one end of the variable capacitance circuit 214 and the second resistor element $R_2$, and the second transistor $M_B$ may receive a bias voltage $V_{GG1}$ through the gate thereof. The other end of the variable capacitance circuit 214 may be connected to the ground. The first transistor $M_A$, having a gate which may serve as an input terminal of the low-noise amplifier 210a, may operate as a common source amplifier, and the second transistor $M_B$, having a drain which may be serve as an output terminal of the low-noise amplifier 210a, may operate as a common gate amplifier. The first transistor $M_A$ and the second transistor $M_B$ may be implemented as a cascade amplifier.

The variable capacitance circuit 214 may include a variable capacitor element $C_K$. (A specific embodiment of the variable capacitance circuit 214 will be described below with reference to FIGS. 6A and 6B.) The variable capacitance circuit 214 may receive a capacitance control signal $CSc_{CAP}$ from the RF controller 109 of FIG. 2, and the capacitance of the variable capacitance circuit 214 may be changed based on the capacitance control signal $CS_{CAP}$. Since one end of the variable capacitance circuit 214 is connected to the gate terminal of the second transistor $M_B$, the capacitance of the variable capacitance circuit 214 may affect a phase characteristic of the common gate amplifier, i.e., the second transistor $M_B$, and by using this structure, the phase of a signal output from the second transistor $M_B$ may be changed. This will be described in detail with reference to FIG. 7. Hereinafter, the operation of the low-noise amplifier 210a will be described.

The first transistor $M_A$ may receive an input signal through the gate thereof. The input signal may be an RF signal (which is a portion of the beam-forming signal received by one of the antennas) having passed through one of the T/R selection switches 108_1 to 108_n and a bandpass filter as shown in FIG. 2. The first transistor $M_A$ may amplify the input signal and output a first output signal through the drain thereof. The second transistor $M_B$ may amplify the first output signal and output a second output signal through the drain thereof, and the variable capacitance circuit 214 may selectively change the phase of the second output signal. For example, as shown in FIG. 4, when a phase change of 22.5 degrees in the second output signal is targeted, the variable capacitance circuit 214 may have a first capacitance value. In addition, when a phase change (or phase lock) of 0 degrees in the second output signal is targeted, the variable capacitance circuit 214 may have a second capacitance value.

As the low-noise amplifier 210a is configured to perform an operation of selectively changing the phase of a signal according to beam-forming, in addition to an amplification operation for a signal, insertion loss may be reduced and the size of an RF chip including the low-noise amplifier 210a and supporting a beam-forming function may be reduced.

The low-noise amplifier 210a shown in FIG. 5 has been presented as an example embodiment, but various alternative designs may be possible. In particular, the low-noise amplifier 210a may be implemented to have various other structures that may perform a selective phase change operation in addition to an amplification operation.

Figure 6A:
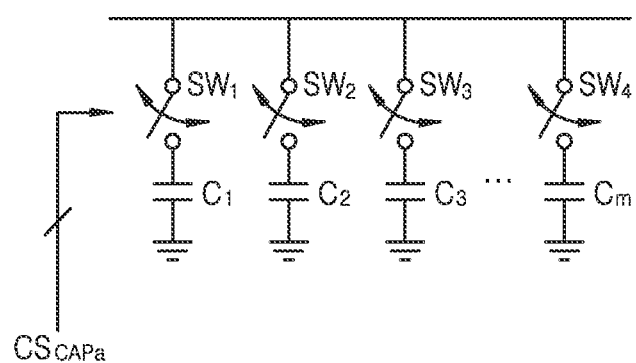
FIGS. 6A and 6B are circuit diagrams illustrating respective embodiments of a variable capacitance circuit in FIG. 5.
Figure 6B:
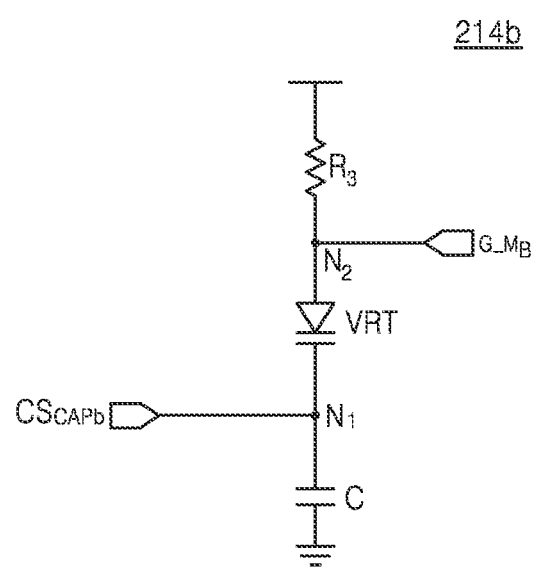

FIGS. 6A and 6B are circuit diagrams illustrating respective embodiments of the variable capacitance circuit 214 in FIG. 5.

Referring to FIG. 6A, a variable capacitance circuit 214a may include a plurality of switch elements $SW_1$ to $SW_m$ and a plurality of capacitor elements $C_1$ to $C_m$. The switch elements $SW_1$ to $SW_m$ may be selectively connected to the capacitor elements $C_1$ to $C_m$, respectively, based on a capacitance control signal $CS_{CAPa}$ corresponding to m-bit data. Through this structure, the capacitance of the variable capacitance circuit 214a may be varied.

Referring to FIG. 6B, a variable capacitance circuit 214b may include a capacitor element C, a resistor element $R_3$, and a varactor element VRT. The varactor element VRT is a variable capacitance diode capable of varying a capacitance value according to a voltage across its anode and cathode. The cathode of the varactor element VRT may be connected to the capacitor element C, and the varactor's anode may be connected to the resistor element $R_3$.

A capacitance control signal $CS_{CAPb}$ having a certain voltage level for controlling a capacitance value of the varactor element VRT may be applied to a first node $N_1$ between the cathode of the varactor element VRT and the capacitor element C. The varactor element VRT may have various capacitance values depending on the voltage level of the capacitance control signal $CS_{CAPb}$. A second node $N_2$ between the anode of the varactor element VRT and the resistor element $R_3$ may be connected to a gate terminal $G\_M_B$ of the second transistor $M_B$ in FIG. 5.

As such, the variable capacitance circuits 214a and 214b may change the respective capacitance values based on the capacitance control signals $CS_{CAPa}$ and $CS_{CAPb}$, respectively, and may provide the changed capacitance values to the second transistor $M_B$ in FIG. 5 and change a phase characteristic of the second transistor $M_B$ in FIG. 5. Thus, a phase change target for beam-forming may be performed on a signal output from the low-noise amplifier 210a.

FIGS. 6A and 6B illustrate merely example embodiments of the variable capacitance circuits 214a and 214b. However, the present disclosure is not limited thereto, and the variable capacitance circuits 214a and 214b may be implemented with various other circuit configurations in which capacitance values may be changed by a control signal.

Figure 7:
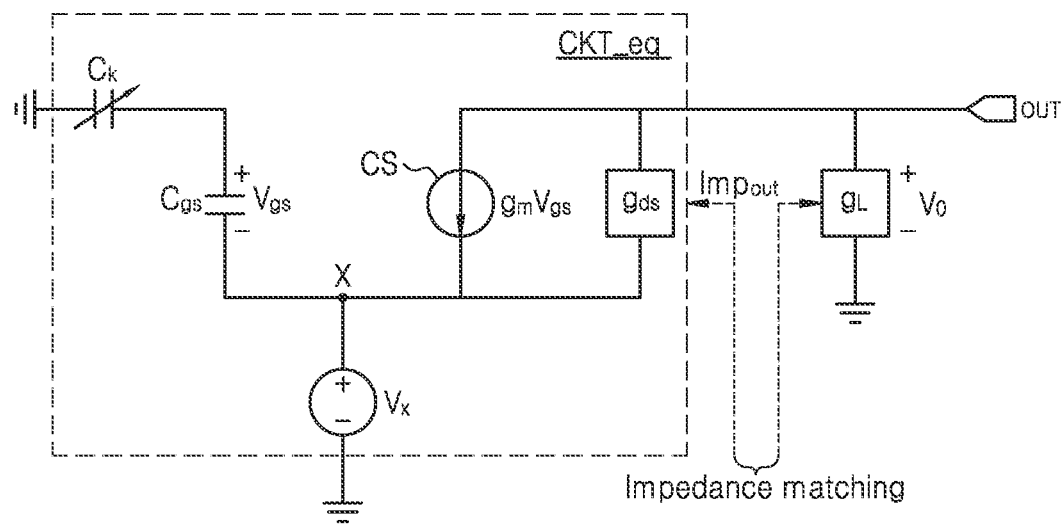
FIG. 7 is a circuit diagram of an equivalent circuit of the low-noise amplifier of FIG. 5 to explain a phase characteristic of a second transistor in FIG. 5.

FIG. 7 is a circuit diagram of an equivalent circuit CKT_eq of the low-noise amplifier 210a of FIG. 5 to explain a phase characteristic of the output signal of the second transistor $M_B$ in FIG. 5. FIG. 7 illustrates an equivalent circuit of the low-noise amplifier 210a which focuses on the second transistor $M_B$.

Referring to FIGS. 5 and 7, the equivalent circuit CKT_eq of the low-noise amplifier 210a may include a variable capacitor element $C_K$, a gate-source capacitor element $C_{gs}$, a current source CS, a first load conductance $g_{ds}$, and a voltage source $V_X$. The variable capacitor element $C_K$ may correspond to the first variable capacitance circuit 214, the gate-source capacitor element $C_{gs}$ may correspond to a capacitance component between the gate terminal and the source terminal of the second transistor $M_B$, and the current source CS may have a value obtained by multiplying a transconductance $g_m$ of the second transistor $M_B$ by a gate-source voltage $V_{gs}$ of the second transistor $M_B$. The gate-source voltage $V_{gs}$ may be a voltage across the gate-source capacitor element $C_{gs}$. The voltage source $V_X$ may correspond to a voltage value at the 'X' node. The first load conductance $g_{ds}$ may include a resistance component and a capacitance component between the drain terminal and the source terminal of the second transistor $M_B$. A second load conductance $g_L$ may include a component for impedance matching with an output impedance $Imp_{out}$ of the equivalent circuit CKT_eq of the low-noise amplifier 210a.

An amplification gain $A_V$ of the low-noise amplifier 210a and a phase characteristic arg(AV) of the low-noise amplifier 210a may be obtained by using the equivalent circuit CKT_eq and summarized by Equations (1) and (2).

$$A_V = \frac{V_O}{V_X} = \frac{g_{ds} + Kg_m}{g_{ds} + g_L}\left(K = \frac{C_K}{C_{gs} + C_K}\right) \quad (1)$$

$$\arg(A_V) = \arctan\left(\frac{\omega C_{ds}}{g_{ds} + Kg_m}\right) - \arctan\left(\frac{\omega C_{ds}}{g_L + g_{ds}}\right) \quad (2)$$

The variable 'K' may be defined as a relationship between a capacitor value of the variable capacitor element $C_K$ and a capacitor value of the gate-source capacitor element $C_{gs}$. That is, since the variable 'K' changes according to a change in the capacitor value of the variable capacitor element $C_K$, the variable 'K' may affect a change in the gain AV of the low-noise amplifier 210a. Equation (3) is an equation obtained by differentiating the gain AV with the variable 'K' to examine an influence of the variable 'K' on the change in the gain $A_V$ of the low-noise amplifier 210a.

$$\left|\frac{\partial A_V}{\partial K}\right| = \left|\frac{g_m}{g_{ds} + g_L}\right| \quad (3)$$

Since the output impedance $Imp_{out}$ of the equivalent circuit CKT_eq has a large value due to characteristics of the structure of the low-noise amplifier 210a, the second load conductance $g_L$ for impedance matching may have a small conductance corresponding to the reciprocal of the output impedance $Imp_{out}$. Referring to Equation (3), since the transconductance $g_m$ of the second transistor $M_B$ and the first load conductance $g_{ds}$ are inherent values determined according to the characteristics of the second transistor $M_B$, a conductance value of the second load conductance $g_L$ has to be greater than a conductance value of the transconductance $g_m$ of the second transistor $M_B$ and a conductance value of the first load conductance $g_{ds}$ to reduce a change in the gain $A_V$ of the second transistor $M_B$. The low-noise amplifier 210a may further include a circuit for lowering the output impedance $Imp_{out}$ to increase the conductance value of the second load conductance $g_L$.

Figure 8:
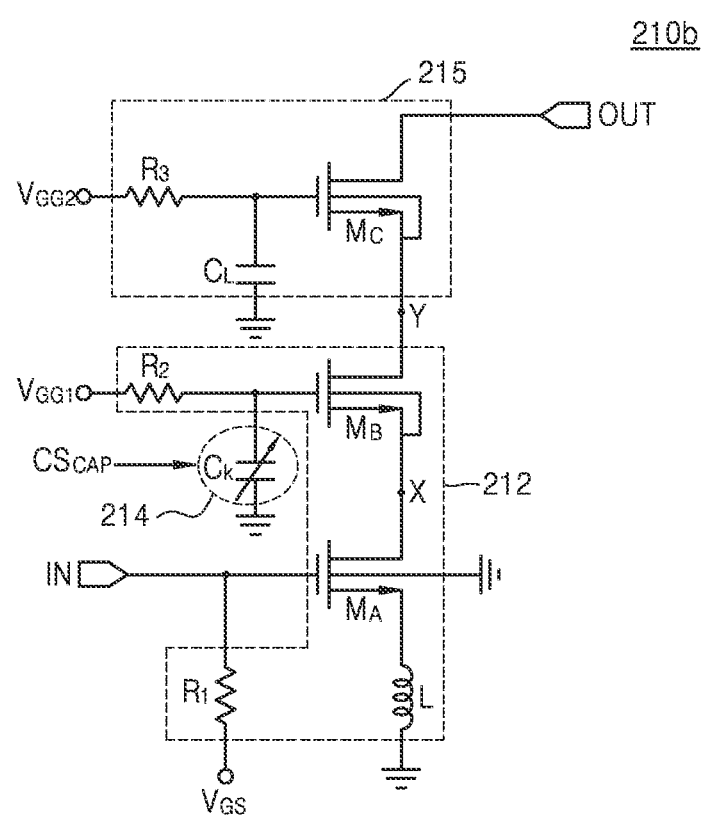
FIG. 8 is a circuit diagram of a low-noise amplifier with a gain fixing circuit capable of reducing variation in amplification gain over a range of phase shifts, according to an embodiment.

FIG. 8 is a circuit diagram of a low-noise amplifier 210b capable of reducing variation in amplification gain across a range of phase shifts, according to an embodiment.

An additional element of the low-noise amplifier 210a of FIG. 5 will be mainly described with reference to FIG. 8, and redundant description of elements already described will be omitted.

As shown in FIG. 8, the low-noise amplifier 210b may further include a gain fixing circuit 215 for reducing a change in the gain as compared with the low-noise amplifier 210a in FIG. 5. The gain fixing circuit 215 may include a third transistor $M_C$, a third resistor element $R_3$, and a capacitor element $C_L$. Gain fixing circuit 215 may also be referred to as a gain variation reduction circuit.

The source of the third transistor $M_C$ may be connected to the drain of the second transistor $M_B$, and a node, to which the source of the third transistor $M_C$ and the drain of the second transistor $M_B$ are connected, may be referred to as a 'Y' node. A gate of the third transistor $M_C$ may be connected to one end of the capacitor element $C_L$ and the third resistor element $R_3$, and the third transistor $M_C$ may receive a bias voltage $V_{GG2}$ through the gate thereof. The other end of the capacitor element $C_L$ may be connected to ground, and the capacitor element $C_L$ may have a fixed capacitance value.

The third transistor $M_C$, which may have a drain serving as an output terminal of the low-noise amplifier 210b, may operate as a common gate amplifier, and the first transistor $M_A$ to the third transistor $M_C$ may be implemented as a cascade amplifier. The third transistor $M_C$ may amplify a second output signal output from the second transistor $M_B$ and output the amplified second output signal as a third output signal.

The gain fixing circuit 215 may provide reduced output impedance to the low-noise amplifier 210b. Thus, a variation in gain due to a selective phase change operation of the low-noise amplifier 210b may be reduced, and thus, a stable amplification operation may be performed simultaneously with a selective phase change operation for a signal.

Various alternative configurations to that of low-noise amplifier 210b shown in FIG. 8 may be possible. In particular, the gain fixing circuit 215 may be implemented to have various alternative structures capable of lowering the output impedance of the low-noise amplifier 210b.

Figure 9A:
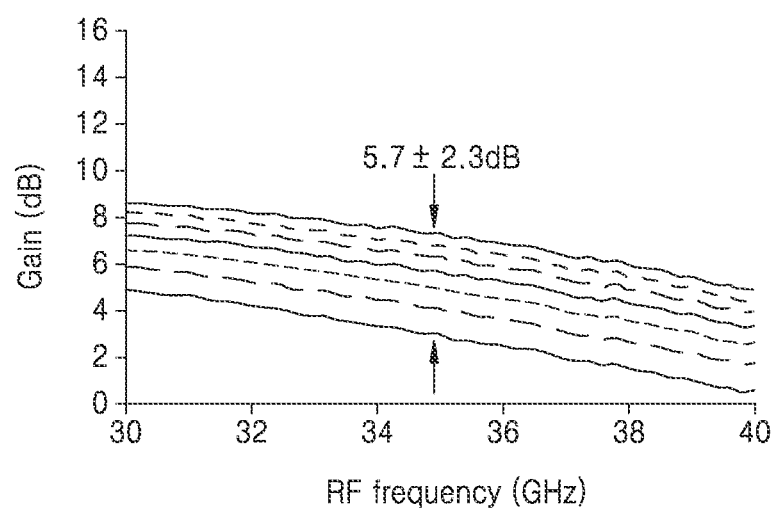
FIG. 9A is a graph of gain vs. frequency over a range of phase shifts for an example case of the low-noise amplifier of FIG. 5.
Figure 9B:
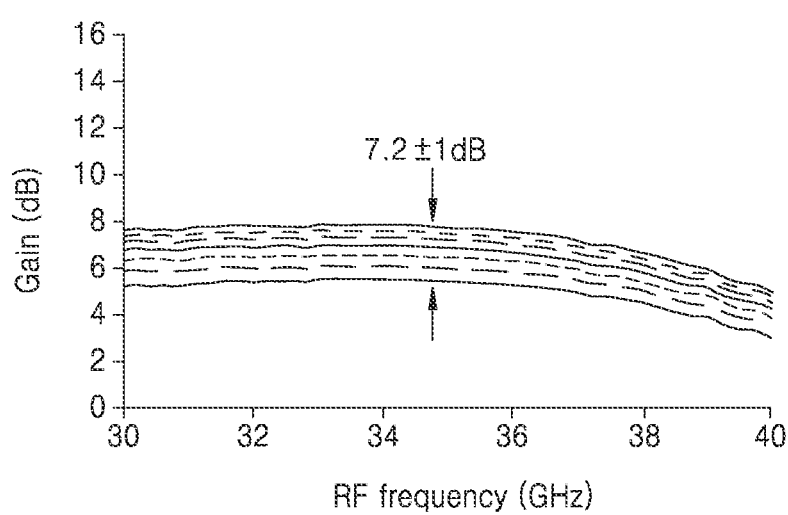
FIG. 9B is a graph of gain vs. frequency over the same range of phase shifts for an example case of the low-noise amplifier with a gain fixing circuit in FIG. 8.

FIGS. 9A and 9B are graphs for explaining effects of amplification gain by the gain fixing circuit 215 in FIG. 8.

FIG. 9A is a graph illustrating example amplification gain vs. frequency when a signal amplification operation of the low-noise amplifier (LNA) 210a of FIG. 5 is performed. FIG. 9B is a graph illustrating example gain vs. frequency when a signal amplification operation of the LNA 210b of FIG. 8 is performed.

Referring to FIG. 9A, when the capacitance value of the variable capacitance circuit 214 is selectively changed, this causes the gain of LNA 210a to vary. When LNA 210a performs a phase change operation of a signal according to beam-forming in addition to a signal amplification operation, the capacitance change may cause gain to vary by about ±2.3 dB over a range of phase shifts in the output signal achieved by LNA 210a. Referring to FIG. 9B, although the capacitance value of the variable capacitance circuit 214 is changed when the LNA 210b performs a phase change operation of a signal according to beam-forming in addition to a signal amplification operation under the same conditions as in FIG. 9A, the gain may vary by a smaller range of about ±1 dB over the same range of phase shifts, due to the operation of gain fixing circuit 215.

In other words, as shown in FIG. 9B, the low-noise amplifier 210b of FIG. 8 including the gain fixing circuit 215 may reduce gain variation and perform a more stable amplification operation.

Figure 10:
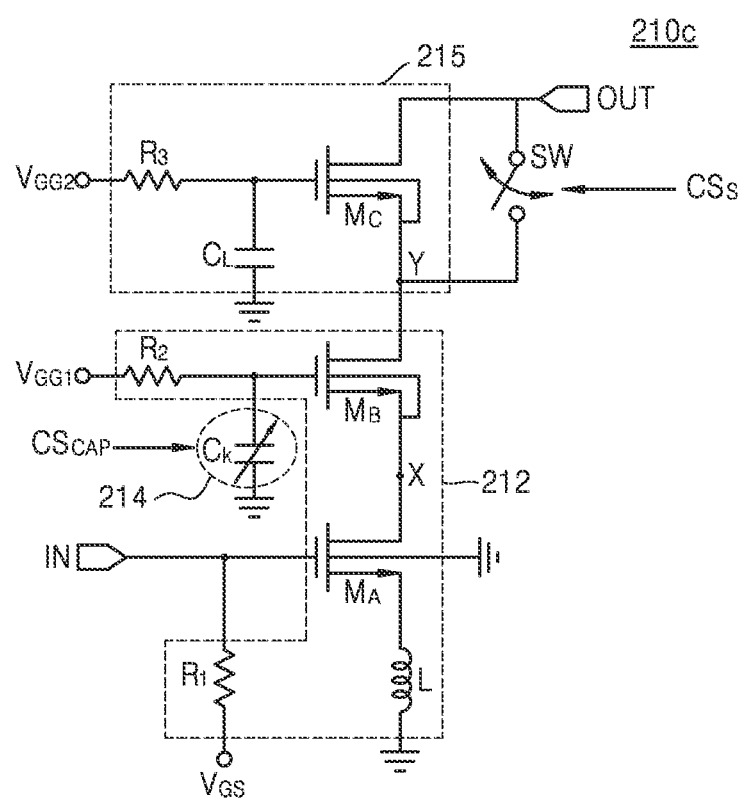
FIG. 10 is a circuit diagram of a low-noise amplifier including a switching element according to an embodiment.
Figure 11A:
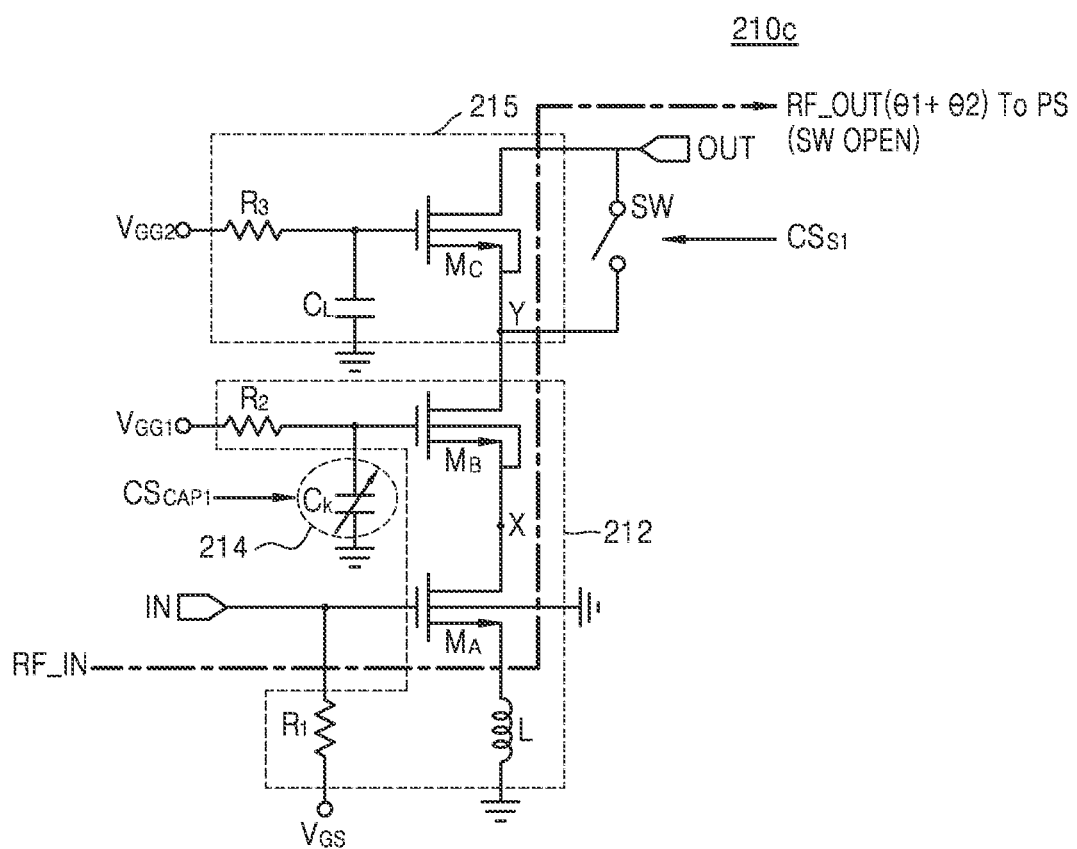
FIGS. 11A and 11B are diagrams for explaining respective modes of operation of amplifier of FIG. 10 with different respective states of the switching element.
Figure 11B:
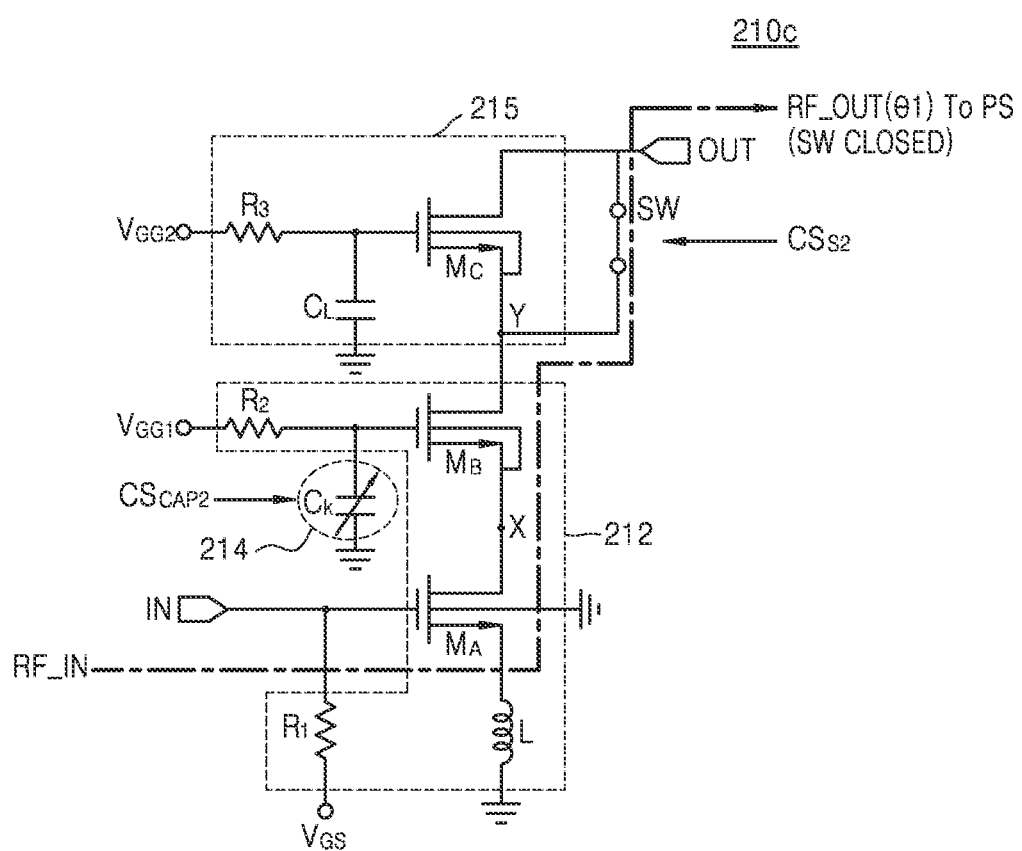

FIG. 10 is a circuit diagram of a low-noise amplifier (LNA) 210c including a switching element according to an embodiment. FIGS. 11A and 11B are diagrams for explaining the operation of the switching element.

An additional element of the low-noise amplifier 210b of FIG. 8 will be mainly described with reference to FIG. 10, and redundant description of elements already described will be omitted.

Referring to FIG. 10, in comparison with LNA 210b of FIG. 8, the low-noise amplifier 210c may further include a switch element SW for efficiently using power. The switch element SW may be connected between a 'Y' node and the drain of the third transistor $M_C$, where the latter also serves as the output terminal OUT of LNA 210c, at which an LNA output signal is provided. The Y node is a node to which the drain of the second transistor $M_B$ and the source of the third transistor $M_C$ are connected. The switch element SW may receive a switching control signal $CS_S$ and turn on/off (close/open) based on the switching control signal $CS_S$. In an embodiment, the RF controller 109 of FIG. 2 may generate the switching control signal $CS_S$ based on beam-forming information and provide the switching control signal $CS_S$ to the switch element SW. The phase of the LNA output signal may be selectively changed depending on the switching state of switch element SW. In the following discussion of FIGS. 11A and 11B, when LNA 210c provides an LNA output signal RF_OUT having a reference phase of θ1, this will be described as condition in which LNA 210c does not change the phase of the signal path based on beam-forming information.

FIG. 11A illustrates an amplification operation when the switching element SW is in an open state. This may cause LNA 210c to have the same or similar operating characteristics of LNA 210b of FIG. 8. (Note that there may be a reactance caused by transmission lines from each of the Y node and the OUT terminal to switching element SW, even when switching element SW is in the open state, which may cause an impedance change or phase variation or the like in comparison with LNA 210b.) For example, according to beam-forming information, the switch element SW may be turned off in response to a first switching control signal $CS_{S1}$. A variable capacitance circuit 214 may change a capacitance value to have a target value for changing the phase of an RF output signal RF_OUT by a second phase θ2 in response to a first capacitance control signal $CS_{CAP1}$. The second phase θ2 may correspond to a degree of phase change determined for beam-forming. As a result, the low-noise amplifier 210c may amplify the RF input signal RF_IN via a cascade amplifier structure composed of the first transistor $M_A$ to the third transistor $M_C$, and may change the phase of the RF output signal RF_OUT by the second phase θ2 via the variable capacitance circuit 214 and the second transistor $M_B$. Hence the LNA output signal, RF_OUT, may be provided with a phase of (θ1+θ2). For instance, the phase of RF_OUT may differ from the phase of an LNA input signal RF_IN by (θ1+θ2). In addition, a change in the amplification gain of the low-noise amplifier 210c due to a phase change operation may be suppressed through a gain fixing circuit 215. The low-noise amplifier 210c may output the RF output signal RF_OUT having a phase changed by the second phase θ2 to a phase shifter (PS) such as a phase shifter 107_1a in FIG. 2.

FIG. 11B illustrates an amplification operation when the low-noise amplifier 210c does not cause an additional phase change of θ2 in the RF input output signal RF_OUT. In this case, the LNA output signal RF_OUT is provided with the reference phase of θ1, which may be a phase difference relative to the phase of the LNA input signal RF_IN. As shown in FIG. 11B, when a phase change operation of LNA 210c is unnecessary according to beam-forming information, the switch element SW may be turned on (closed) in response to a second switching control signal $CS_{S2}$. The variable capacitance circuit 214 may change a capacitance value to have a target value for fixing the phase of the RF output signal RF_OUT in response to a second capacitance control signal $CS_{CAP2}$. As a result, the low-noise amplifier 210c may amplify the RF input signal RF_IN via a cascade amplifier structure composed of the first transistor $M_A$ and the second transistor $M_B$ and output the RF output signal RF_OUT to a phase shifter without changing the phase of the RF output signal RF_OUT. If, while the switching element SW remains in the closed state, the capacitance control signal $CS_{CAP2}$ remains constant, LNA 210c does not perform a phase change operation. In this scenario, the gain of the low-noise amplifier 210c may be relatively constant, and the role of the gain fixing circuit 215 for reducing variation in the gain of LNA 210c according to the phase change operation may be unnecessary. Thus, by deactivating the gain fixing circuit 215 through use of the switch element SW, power consumed by the gain fixing circuit 215 may be reduced.

In another operating mode, with the switching element SW in a closed state, the capacitance control signal $CS_{CAP2}$ may be allowed to vary, according to beam-forming related information, between at least two capacitance values, each corresponding to a target phase of the LNA output signal RF_OUT. Further, when the switching element SW is controlled to be open as in FIG. 11A, the capacitance control signal $CS_{CAP2}$ may be allowed to vary according to beam-forming related information between at least two capacitance values, which may be the same or different from those used when the switching element SW is closed. By allowing for different capacitance control signals in both switching states of switching element SW, the LNA output signal RF_OUT may be selectively provided at one of at least four target phases: two for the closed switching state and two for the open switching state.

Figure 12:
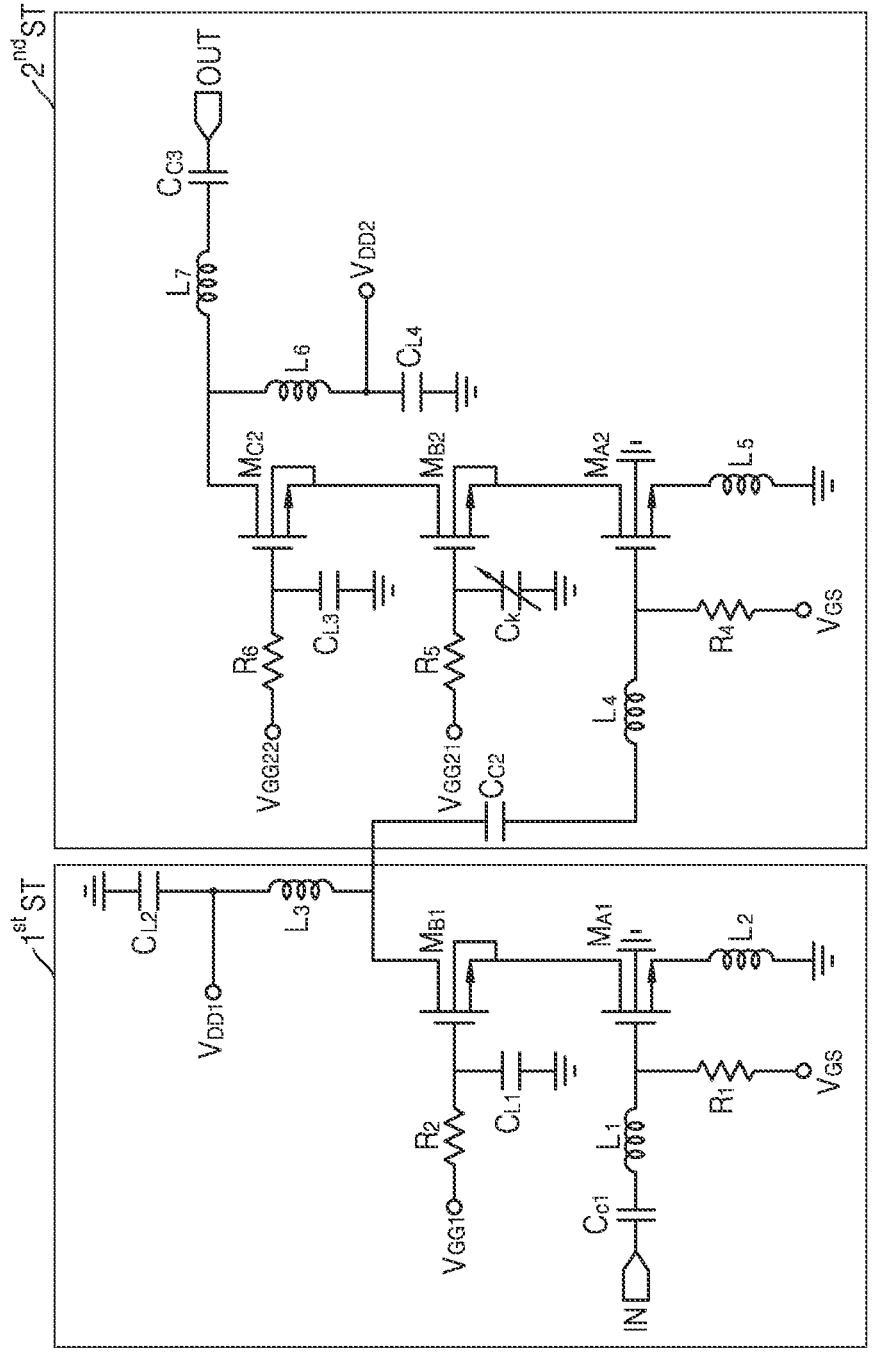
FIG. 12 is a circuit diagram of a low-noise amplifier implemented in two stages according to an embodiment.

FIG. 12 is a circuit diagram of a low-noise amplifier, 310, implemented in two stages according to an embodiment. Low-noise amplifier 310 may include a first stage circuit $1^{st}$ ST and a second stage circuit $2^{nd}$ ST. The first and second stage circuits $1^{st}$ ST and $2^{nd}$ ST may be referred to as amplification blocks or amplifier circuits. The first stage circuit $1^{st}$ ST may be referred to as a low noise amplification buffer circuit, and the second stage circuit $2^{nd}$ ST may be referred to as a low noise phase shift circuit. The first stage circuit $1^{st}$ ST may primarily amplify a received signal, and the second stage circuit $2^{nd}$ ST may secondarily amplify the primarily amplified signal and selectively change the phase of a final output signal according to beam-forming. The gain of the first stage circuit $1^{st}$ ST may be higher than the gain of the second stage circuit $2^{nd}$ ST.

The first stage circuit $1^{st}$ ST may include first and second transistors $M_{A1}$ and $M_{B2}$, resistor elements $R_1$ and $R_2$, capacitor elements $C_{C1}$, $C_{L1}$ and $C_{L2}$, and inductor elements $L_1$, $L_2$ and $L_3$. The first transistor $M_{A1}$, which may be coupled to an input terminal IN of the first stage circuit $1^{st}$ ST through an input filter comprising capacitor $C_{C1}$ and inductor $L_1$, may operate as a common source amplifier. The second transistor $M_{B1}$, which may have a drain connected to an output terminal of the first stage circuit $1^{st}$ ST, may operate as a common gate amplifier. The first transistor $M_{A1}$ and the second transistor $M_{B2}$ may be implemented as a cascade amplifier. The first stage circuit $1^{st}$ ST may receive a signal through the gate of the first transistor $M_{A1}$, receive a bias voltage $V_{GG1}$ through a gate of the second transistor $M_{B2}$, and receive a power supply voltage $V_{DD1}$ through a node between the capacitor element $C_{L2}$ and the inductor element $L_3$.

The second stage circuit $2^{nd}$ ST may include third to fifth transistors $M_{A2}$, $M_{B2}$ and $M_{C2}$, resistor elements $R_4$, $R_5$ and $R_6$, a variable capacitor element $C_K$, capacitor elements $C_{C2}$, $C_{C2}$, $C_{L3}$, and $C_{L4}$, and inductor elements $L_4$, $L_5$, $L_6$ and $L_7$. The third transistor $M_{A2}$, which may be coupled to an input terminal of the second stage circuit $2^{nd}$ ST through an input filter comprising capacitor $C_{C2}$ and inductor $L_4$, may operate as a common source amplifier, and the fourth transistor $M_{B2}$ may operate as a common gate amplifier. The fifth transistor $M_{C2}$, which may be coupled to an output terminal of the second stage circuit $2^{nd}$ ST via an output filter comprising inductor $L7$ and capacitor $C_{C3}$, may operate as a common gate amplifier. The third to fifth transistors $M_{A2}$ to $M_{C2}$ may be implemented as a cascade amplifier. The second stage circuit $2^{nd}$ ST may receive a signal through the gate terminal of the third transistor $M_{A2}$, receive bias voltages $V_{GG21}$ and $V_{GG22}$ through the gate terminal of the fourth transistor $M_{B2}$ and the gate terminal of the fifth transistor $M_{C2}$, and receive a power supply voltage $V_{DD2}$ through a node between the inductor element $L_6$ and the capacitor element $C_{L4}$. In the second stage circuit $2^{nd}$ ST, the capacitance of the variable capacitor element $C_K$ may be changed to selectively change the phase of an output signal according to beam-forming, as described above. The configuration and operation of the second stage circuit $2^{nd}$ ST have been described above with reference to FIGS. 5 and 8, and thus, the detailed description thereof will be omitted.

The low-noise amplifier 310 implemented in two stages is merely an example embodiment, and various alternative configurations may be available. In particular, the second stage circuit $2^{nd}$ ST may be implemented to have various alternative structures that may perform a selective phase change operation in addition to an amplification operation.

As mentioned earlier, in the transmit signal paths, the power amplifiers PS_PA 106_1 to 106_n, like the low-noise amplifiers 107_1 to 107_n, may each have configurations with selective phase change capability, to enable flexibility in design for beam steering a transmit beam. Any of the above-described configurations for a low-noise amplifier 105_i, such as those of LNAs 210, 210a, 210b, 210c or 310, may be used for any power amplifier 106_i.

Figure 13:
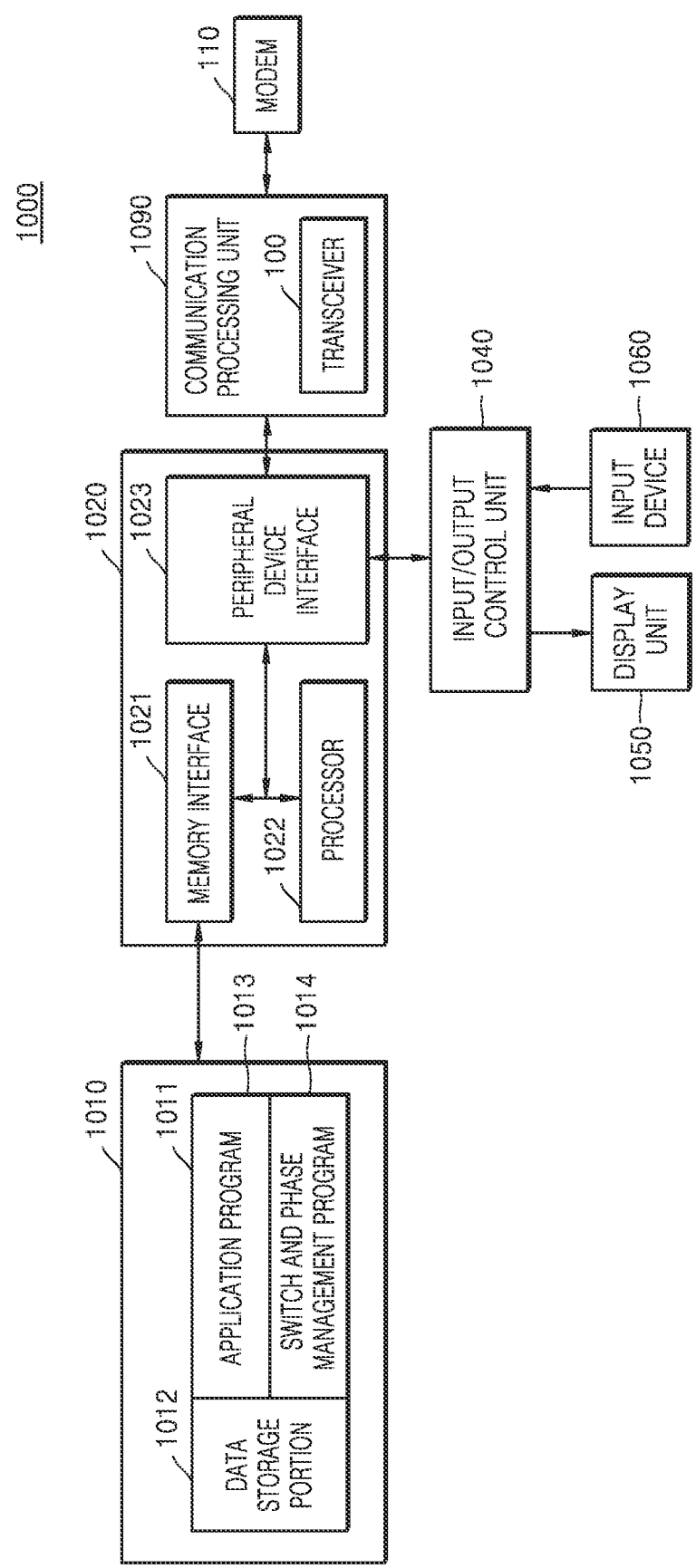
FIG. 13 is a block diagram of an electronic device supporting a communication function including a beam-forming function according to an embodiment.

FIG. 13 is a block diagram of an electronic device, 1000, supporting a communication function including a beam-forming function according to an embodiment. Electronic device 1000 may include memory 1010, a processor unit 1020, an input/output control unit 1040, a display unit 1050, an input device 1060, modem 110, and a communication processing unit 1090 which includes transceiver 100. Memory 1010 may be composed of multiple memories of the same or different types.

The memory 1010 may include a program storage portion 1011 for storing a program for controlling an operation of the electronic device 1000 and a data storage portion 1012 for storing data generated during program execution. The data storage portion 1012 may store data utilized for operations of an application program 1013 and a switch and phase management program 1014. The program storage portion 1011 may include the application program 1013 and the switch and phase management program 1014. Programs in the program storage portion 1011 may be expressed as an instruction set (a set of instructions).

The application program 1013 may run on electronic device 1000 by means of processor 1022 reading and executing instructions thereof. The switch and phase management program 1014 may control operations of a low-noise amplifier and a phase shifter according to the present disclosure as described above. In other words, the switch and phase management program 1014 may determine the degree of phase change for beam-forming in at least one of the receive signal paths and send information about the degree of phase to a main controller (or RF controller) of a modem. (Herein, a controller may be interchangeably referred to as a control circuit.) In an embodiment, program 1014 controls phase in each of the receive signal paths by controlling the phase shift of each PS_LNA 105-1 to 105_n and each phase shifter 107_1 to 107_n (if the phase shifters are included).

In addition, the switch and phase management program 1014 determines whether the electronic device 1000 operates in a transmission mode or a reception mode, and transmits information about the determination to the main controller of the modem. A memory interface 1021 may control access to the memory 1010 of components such as a processor 1022 or a peripheral device interface 1023. The switch and phase management program 1014 may also be configured to control beam-forming on the transmit side by controlling phase in at least one of the transmit signal paths in an analogous manner as for the at least one receive signal path.

The peripheral device interface 1023 may control the connection of the processor 1022 and the memory interface 1021 to an input/output peripheral device of a base station. The processor 1022 controls the base station to provide a service by using at least one software program. In this case, the processor 1022 may execute at least one program stored in the memory 1010 to provide a service corresponding to the at least one program.

The input/output control unit 1040 may provide an interface between an input/output device, such as the display unit 1050 and the input device 1060, and the peripheral device interface 1023. The display unit 1050 displays status information, input characters, moving images (video), still images, and the like. For example, the display unit 1050 may display information about an application program driven by the processor 1022.

The input device 1060 may provide input data generated by the selection of the electronic device 1000 to the processor unit 1020 via the input/output control unit 1040. In this case, the input device 1060 may include a keypad including at least one hardware button and a touchpad for sensing touch information. For example, the input device 1060 may provide touch information, such as a touch, a touch movement, and a touch release sensed through the touchpad, to the processor 1022 via the input/output control unit 1040.

The electronic device 1000 may include a communication processing unit 1090 that performs communication functions for voice communication and data communication. The communication processing unit 1090 may include a low-noise amplifier capable of supporting a beam-forming function as described above with reference to FIG. 2 and the like, and may also include an RF controller or modem capable of controlling a selective phase change of the low-noise amplifier.

While the inventive concept has been particularly shown and described with reference to embodiments thereof, it will be understood that various changes in form and details may be made therein without departing from the spirit and scope of the following claims.

What is claimed is:

1. A receiver for supporting a beam-forming function by using a plurality of antennas, the receiver including:
    a first low-noise amplifier connected to a first antenna of the plurality of antennas and including a first amplifier circuit and a first phase shift circuit; and
    a first phase shifter connected to the first low-noise amplifier and including a plurality of first phase shift blocks,
    wherein the first phase shift circuit includes a first variable capacitor element for selectively changing a phase of a first amplified signal output from the first amplifier circuit, and
    a phase change degree of the first phase shift circuit is smaller than a phase change degree of each of the plurality of first phase shift blocks.

2. The receiver of claim 1, wherein the phase shift circuit is configured to change the phase of the first amplified signal by 22.5 degrees ($\pi/8$ radians),
    wherein each of the plurality of phase shift blocks are configured to change the phase of the first amplified signal by 45 degrees ($\pi/4$ radians) or 90 degrees ($\pi/2$ radians) or 180 degrees ($\pi$ radians).

3. The receiver of claim 1, each of the first phase shift circuit and the plurality of first phase shifter blocks is configured to selectively operate to shift the first amplified signal by a target phase in response to a control signal.

4. The receiver of claim 3, wherein the control signal is generated based on information about the beam-forming signal.

5. The receiver of claim 1, wherein the first variable capacitor element includes a plurality of capacitor elements and a plurality of switch elements respectively connected to the plurality of capacitor elements.

6. The receiver of claim 1, wherein the first amplifier circuit includes a first transistor that amplifies a first signal received through a gate thereof and provides a second signal at a drain thereof; and
    a second transistor having a source connected to the drain of the first transistor, the second transistor amplifying the second signal to provide the first amplified signal at a drain thereof.

7. The receiver of claim 6, wherein the first phase shift circuit is configured to be connected to a gate of the second transistor.

8. The receiver of claim 1, the receiver further including:
    a second low-noise amplifier connected to a second antenna of the plurality of antennas and including a second amplifier circuit and a second phase shift circuit; and
    a second phase shifter connected to the second low-noise amplifier and including a plurality of second phase shift blocks,
    wherein the second phase shift circuit includes a second variable capacitor element for selectively changing the phase of a second amplified signal output from the second amplifier circuit, and
    the phase change degree of the second phase shift circuit is smaller than the phase change degree of each of the plurality of second phase shift blocks.

9. The receiver of claim 8, further including:
    a combiner configured to combine the first and the second amplifier signals to output a combined signal; and
    a mixer configured to frequency-downconvert the combined signal.

10. The receiver of claim 1, wherein the first low-noise amplifier further includes a gain fixing circuit configured to limit a gain variation about the first amplified signal due to the change in capacitance of the variable capacitor element within a range of about ±1 dB.

11. A receiver for receiving a beam-forming signal via a plurality of antennas, the receiver including:
    a first amplifier circuit including a first transistor for amplifying an input signal to provide a first amplified signal, the input signal being derived from a portion of the beam-forming signal received by one of the antennas;
    a second amplifier circuit including a second transistor for amplifying the first amplified signal to generate a corresponding output signal;
    a variable capacitance circuit for selectively changing capacitance thereof to cause a corresponding phase change in the output signal and form a beam pointing in a selectable direction for receiving the beam-forming signal; and
    a gain fixing circuit including a third transistor for receiving the output signal, amplifying the output signal and outputting the amplified output signal.

12. The receiver of claim 11, wherein the gain fixing circuit is configured to limit a gain variation about the output signal due to the change in capacitance of the variable capacitance circuit within a range of about ±1 dB.

13. The receiver of claim 11, wherein the first transistor, the second transistor and the third transistor are connected as a cascade amplifier.

14. The receiver of claim 11 wherein:
    the first, second and third transistors each have a gate, a source and a drain;
    the first transistor receives the input signal through its gate and outputs the first amplified signal through its drain;
    the second transistor is connected to the variable capacitance circuit through its gate, is connected through its source to the drain of the first transistor, and outputs the output signal through its drain; and
    the third transistor is connected through its source to the drain of the second transistor and outputs the amplified output signal through its drain.

15. The receiver of claim 11, wherein the gain fixing circuit further includes a switch element connected between a drain of the third transistor and a node, to which the drain of the second transistor and the source of the third transistor are connected.

16. A transceiver for supporting a beam-forming function, comprising:
    a receiver portion comprising:
    N receive signal paths respectively coupled to N antennas that collectively receive a beam-forming signal, each of the N receive signal paths including:
    a phase shift low-noise amplifier comprising:
    a first amplifier circuit comprising a first transistor for amplifying an input signal to provide a first amplified signal, the input signal being derived from a portion of the beam-forming signal received by a respective one of the N antennas;

a second amplifier circuit comprising a second transistor for amplifying the first amplified signal to generate a corresponding output signal; and a variable capacitance circuit for selectively changing capacitance thereof to cause a corresponding phase change in the output signal; and a transmitter portion comprising N phase shift power amplifiers, each having substantially the same configuration as the phase shift low-noise amplifier.

17. The transceiver of claim 16, wherein each of the N phase shift power amplifiers is provided in a respective one of N transmit signal paths, and the transceiver further comprising N transmit/receive (T/R) switches, each having: an input terminal coupled to one of the N antennas, a first output terminal coupled to one of the N receive signal paths, and a second output terminal coupled to one of the N transmit signal paths.

18. The transceiver of claim 17, further comprising N receive path phase shifters, each coupled to an output terminal or an input terminal of a respective said phase shift low-noise amplifier, each receive path phase shifter operable to change the phase of the output signal.

19. The transceiver of claim 18, further comprising N transmit path phase shifters, each coupled to an output terminal or an input terminal of a respective one of the N phase shift power amplifiers.

20. The transceiver of claim 16, wherein the variable capacitance circuit is configured to receive a capacitance control signal to change the capacitance.

* * * * *